United States Patent
Tang (10) Patent No.: US 9,501,261 B2
(45) Date of Patent: Nov. 22, 2016

(54) BINARY ARRAY WITH LSB DITHERING IN A CLOSED LOOP SYSTEM

(71) Applicant: QUALCOMM Incorporated, San Diego, CA (US)

(72) Inventor: Zhilong Tang, Irvine, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 312 days.

(21) Appl. No.: 14/271,402

(22) Filed: May 6, 2014

(65) Prior Publication Data

US 2015/0324170 A1 Nov. 12, 2015

(51) Int. Cl.
- *G06F 7/00* (2006.01)
- *G06F 7/485* (2006.01)
- *H03M 1/08* (2006.01)
- *H03M 1/06* (2006.01)
- *H03M 1/74* (2006.01)

(52) U.S. Cl.
CPC ............ *G06F 7/485* (2013.01); *H03M 1/0863* (2013.01); *H03M 1/0639* (2013.01); *H03M 1/74* (2013.01)

(58) Field of Classification Search
None
See application file for complete search history.

(56) References Cited

U.S. PATENT DOCUMENTS

| | | | |
|---|---|---|---|
| 5,172,247 A | 12/1992 | Ghaderi | |
| 5,341,228 A * | 8/1994 | Parker | G06T 3/40 358/3.19 |
| 5,561,714 A | 10/1996 | Hershberger | |
| 7,233,963 B2 * | 6/2007 | Snyder | H04N 19/126 375/E7.14 |
| 7,348,839 B2 | 3/2008 | Fahim et al. | |
| 2002/0087610 A1 * | 7/2002 | Pether | G06F 7/48 708/551 |
| 2010/0253821 A1 | 10/2010 | Yamamoto | |
| 2012/0050206 A1 * | 3/2012 | Welland | G06F 3/044 345/174 |
| 2012/0287141 A1 * | 11/2012 | Higgins | H04N 19/59 345/581 |
| 2014/0002205 A1 | 1/2014 | Komijani et al. | |
| 2015/0324170 A1 * | 11/2015 | Tang | G06F 7/485 708/672 |

OTHER PUBLICATIONS

International Search Report and Written Opinion—PCT/US2015/026841—ISA/EPO—Sep. 21, 2015.
Jensen H.T., et al., "An Analysis of the Partial Randomization Dynamic Element Matching Technique", IEEE Transactions on Circuits and Systems II: Analog and Digital Signal Processing, Institute of Electrical and Electronics Engineers Inc, 345 East 47 Street, New York, NY, 10017, USA, vol. 45. No. 12, Dec. 1998 (Dec. 1998), pp. 1538-1549, XP011012950, ISSN: 1057-7130, p. 2, left-hand column—p. 3, left-hand column p. 4, right-hand column Equation (1) figures 3,4.

* cited by examiner

*Primary Examiner* — David H Malzahn
(74) *Attorney, Agent, or Firm* — Arent Fox LLP (57) ABSTRACT

A binary array system and method for operating an electrical system are disclosed. The binary array system includes a binary counter configured to output a number of bit values through a number of bit outputs. Each of the bit values are output through a corresponding one of the bit outputs. The system includes a number of binary array elements. Each of the binary array elements is coupled to a corresponding one of the bit outputs and is configured to provide a unit value based on one of the bit values output through the corresponding one of the bit outputs. The binary array system also includes a controller coupled to the binary counter that is configured to set the bit values of the binary counter.

27 Claims, 6 Drawing Sheets

BINARY ARRAY WITH LSB DITHERING IN A CLOSED LOOP SYSTEM

BACKGROUND

Field

The present disclosure relates generally to electrical systems, and more particularly, to a binary array with least significant bit (LSB) dithering in a closed loop system.

Background

Binary arrays are often used in path-programmable logic (PPL) and other closed loop systems. Binary arrays may be a circuit element with an adjustable value based on a received input. The ability to adjust the value of the binary array based on the input into the binary array makes the binary array a useful tool.

SUMMARY

Aspects of a binary array system are disclosed. The binary array system may include a binary counter configured to output a plurality of bit values through a plurality of bit outputs. Each of the bit values may be output through a corresponding bit output. The binary array system may include a binary array having a plurality of binary array elements. Each of the binary array elements may be coupled to a corresponding bit output and configured to provide a unit value based on one of the bit values output through the corresponding one of the bit outputs. The binary array system may include a controller coupled to the binary counter and configured to set the bit values such that only a least significant bit of the bit values transitions from a first state to a second state in order to effectuate an incremental change in the total unit value provided by the binary array elements.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Various apparatus and methods presented throughout this disclosure may be implemented in various forms of hardware. By way of example, any of these apparatus or methods, either alone or in combination, may be implemented as an integrated circuit, or as part of an integrated circuit. The integrated circuit may be an end product, such as a microprocessor, a digital signal processor (DSP), an application specific integrated circuit (ASIC), programmable logic, or any other suitable integrated circuit. Alternatively, the integrated circuit may be integrated with other chips, discrete circuit elements, and/or other components as part of either an intermediate product, such as a motherboard, or an end product. The end product can be any suitable product that includes integrated circuits, including by way of example, a cellular phone, a personal digital assistant (PDA), a laptop computer, a desktop computer (PC), a computer peripheral device, a multimedia device, a video device, an audio device, a global positioning system (GPS), a wireless sensor, or any other suitable device.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of the stated features, integers, steps, operations, elements, and/or components, but do not preclude the presence or addition of one or more other features, integers, steps, operations, elements, components, and/or groups thereof. Various aspects of binary array systems will now be presented. However, as those skilled in the art will readily appreciate, such aspects may be extended to other binary array system configurations. Accordingly, all references to a specific application for a binary array system are intended to illustrate only exemplary aspects of a binary array system with the understanding that such aspects may have a wide range of applications.

Figure 1:
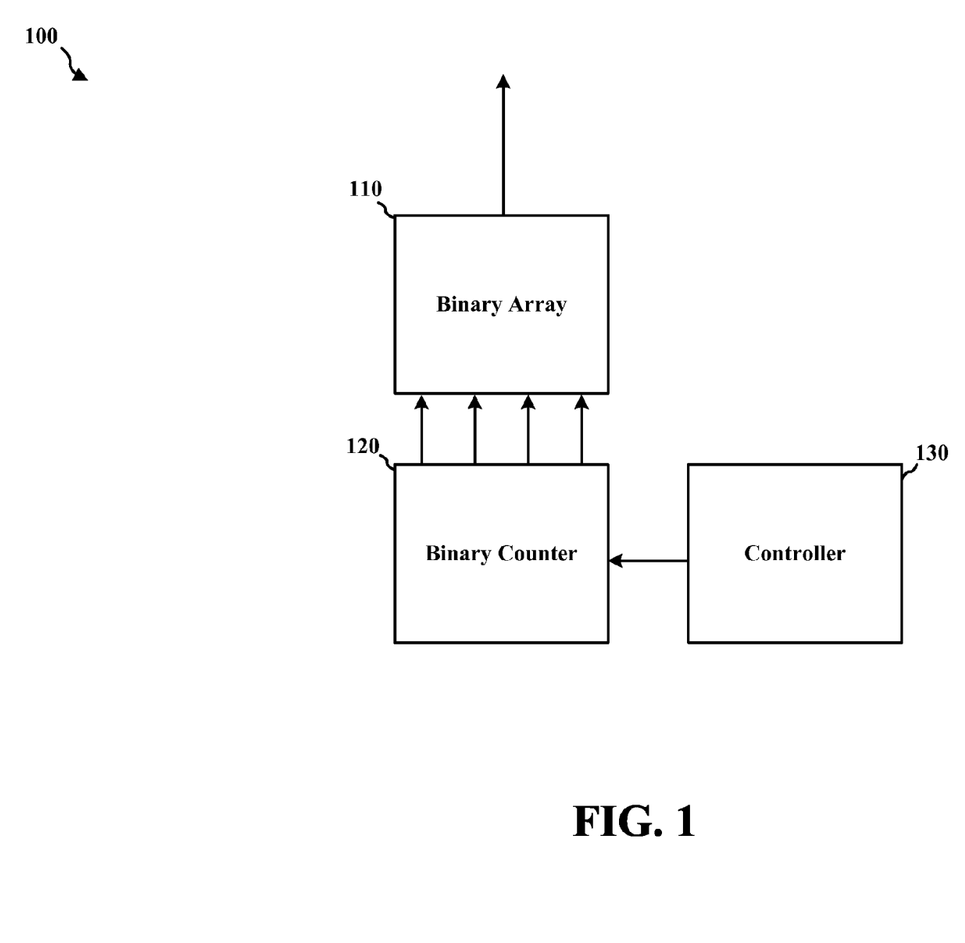
FIG. 1 is a block diagram illustrating an exemplary embodiment of a binary array system.

FIG. 1 is a block diagram illustrating an exemplary embodiment of a binary array system 100. The binary array system 100 includes a binary array 110, a binary counter 120, and a controller 130. The binary array 110 may include a number of binary array elements. The binary array 110 may be any type of binary array, including a current source binary array with a number of current sources, a resistor binary array with a number of resistors, or a capacitor binary array with a number of capacitors, etc. If the binary array is a current source array, the current source may be a current-starving ring oscillator. The binary array 110 is coupled to the binary counter 120. The binary counter 120 has a number of bit outputs and is configured to output a respective bit value through each of the bits outputs. Each binary array element of the binary array 110 may be coupled to a corresponding one of the number of bit outputs of the binary counter 120. In response to an output from a corresponding bit output of the binary counter 120, the respective binary array element may be configured to provide a unit value (e.g., 1 ampere (A), 1 ohm, etc.) depending on the type of binary array being utilized. The binary counter 120 is coupled to the controller 130. The controller 130 is configured to set the bit values output by the binary counter 120.

Figure 2:
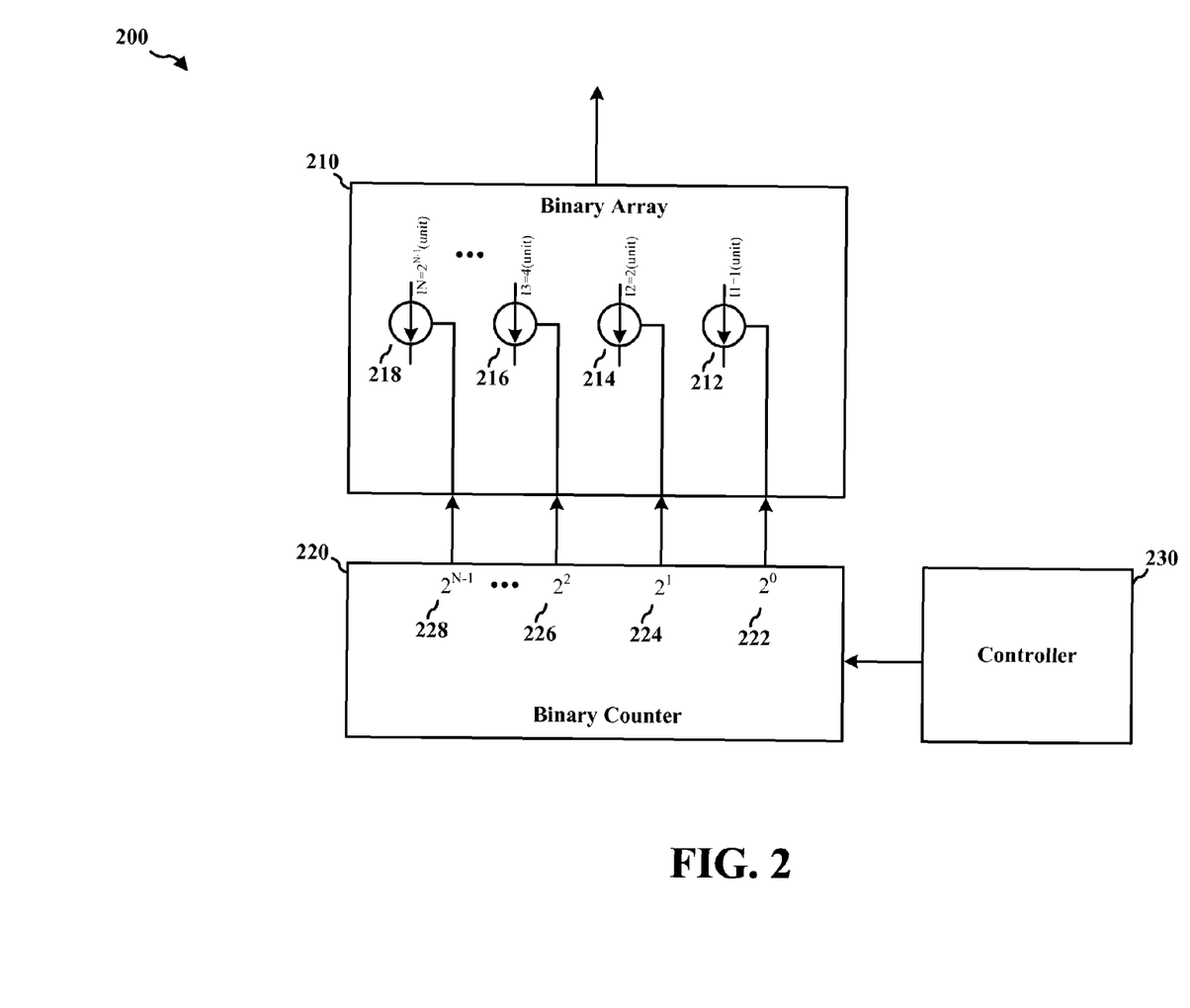
FIG. 2 is a block diagram illustrating a binary array system with a binary array.

FIG. 2 is a block diagram illustrating a binary array system 200 with a binary array. Although FIG. 2 provides an example using a binary current source array, other types of binary arrays, such as resistor arrays and capacitors arrays, may be used. As shown in FIG. 2, the binary array system 200 includes a binary array 210 with a number of binary array elements 212, 214, 216, 218. For example, the binary array elements 212, 214, 216, 218 may be current sources. In another example, the binary array elements 212, 214, 216, 218 may be resistors, capacitors, or other elements.

In one configuration, there may be N binary array elements 212, 214, 216, 218 where N is an integer greater than one. Each of the binary array elements 212, 214, 216, 218 may output a unit value. For example, if N=4, there may be four binary array elements. If the binary array elements 212, 214, 216, 218 are current sources, the first binary array element 212 may be configured to provide a unit value of 1 A, the second binary array element 214 may be configured to provide a unit value of 2 A, the third binary array element 216 may be configured to provide a unit value of 4 A, and the fourth binary array element 218 may be configured to provide a unit value of 8 A. The binary array elements 212, 214, 216, 218 are coupled to a binary counter 220.

The binary counter 220 is configured to output bit values through each of a number of bit outputs 222, 224, 226, 228. For example, each of the bit outputs 222, 224, 226, 228 may output a bit value of 0 or 1. Each of the binary array elements 212, 214, 216, 218 is coupled to a corresponding one of the bit outputs 222, 224, 226, 228. In one configuration, the first binary array element 212 is coupled to a first bit output 222, the second binary array element 214 is coupled to a second bit output 224, the third binary array element 216 is coupled to a third bit output 226, and the fourth binary array element 218 is coupled to a fourth bit output 228. When a bit output on the binary counter 220 outputs 0 (off state), the corresponding binary array element is turned off. When a bit output on the binary counter 220 outputs 1 (on state), the corresponding binary array element is turned on.

The binary array system 200 includes a controller 230, which may be a processor, microprocessor, DSP, ASIC, programmable logic, or any other suitable electronic circuit. The controller 230 is coupled to the binary counter 220 and is configured to set the bit outputs 222, 224, 226, 228 of the binary counter 220. Although illustrated in FIG. 2 as separate components, the binary counter 220 and the controller 230 may be a single component such as a processor.

TABLE 1

| Binary Counter Value | Binary Counter Bit Values | Binary Array Total Unit Value |
|---|---|---|
| 0 | 0000 | 0 A |
| 1 | 0001 | 1 A |
| 2 | 0010 | 2 A |
| 3 | 0011 | 3 A |
| 4 | 0100 | 4 A |

Table 1 illustrates the total unit value provided by the binary array 210 in response to bit values output by the binary counter 220 in FIG. 2. As shown in Table 1, when the binary counter 220 is at 0, the set of bit outputs 222, 224, 226, 228 is equal to 0000. In this instance, all of the binary array elements 212, 214, 216, 218 are turned off and the total unit value provided by the binary array 210 is 0 A. When the controller 230 causes the binary counter 220 to count to 1, the set of bit outputs 222, 224, 226, 228 is equal to 0001. In this instance, the first binary array element 212 is turned on, but all the other binary array elements 214, 216, 218 are turned off. The total unit value provided by the binary array 210 is 1 A. When the controller 230 causes the binary counter 220 to count to 2, the set of bit outputs 222, 224, 226, 228 is equal to 0010. In this instance, the second binary array element 214 is turned on, but all the other binary array elements 212, 216, 218 are turned off. The total unit value provided by the binary array 210 is 2 A. When the controller 230 causes the binary counter 220 to count to 3, the set of bit outputs 222, 224, 226, 228 is equal to 0011. In this instance, the first and second binary array elements 212, 214 are turned on, but the remaining third and fourth binary array elements 216, 218 are turned off. The total unit value provided by the binary array 210 is 3 A. When the controller 230 causes the binary counter 220 to count to 4, the set of bit outputs 222, 224, 226, 228 is equal to 0100. In this instance, the third binary array element 216 is turned on, but the remaining binary array elements 212, 214, 218 are turned off. The total unit value provided by the binary array 210 is 4 A.

As configured, the binary array 210 presents a common problem. In typical circuit operations, the binary counter 220 may dither between two values due to signal granularity. For example, when a system requires the binary array 210 to output 4 A, the controller 230 may be configured to cause the binary counter 220 to count to 4 and output bit values equal to 0100. Due to signal granularity, however, the bit outputs 222, 224, 226, 228 of the binary counter 220 may dither between 0100 and 0011. When this dithering happens, a glitch may occur when one or more bits, including the most significant bit (MSB), changes. The glitch may be caused by a delay in changing the bit outputs 222, 224, 226, 228. For example, if the binary counter 220 dithers between 3 and 4, the bit outputs 222, 224, 226, 228 of the binary counter 220 will dither between 0011 and 0100. In one scenario, if the bit outputs 222, 224, 226, 228 are in transition from 0011 to 0100, and a delay in bit switching occurs, a delay may result in the binary counter 220 outputting 0000, if only the first and second bit outputs 222, 224 change while the third bit output 226 stays the same. As a result, the binary array 210 would provide a total unit value of 0 A. In another scenario, the delay may result in the binary counter 220 outputting 0111, if only the third bit output 226 changes. In this scenario, the binary array 210 would output a total unit value of 7 A. Thus, when the binary counter 220 dithers due to signal granularity, the total unit value provided by the binary array 210 may swing between 0 A and 7 A rather than between 3 A and 4 A. This represents a large, unintended glitch, and a need exists to reduce such swings and glitches when operating a binary array.

Figure 3:
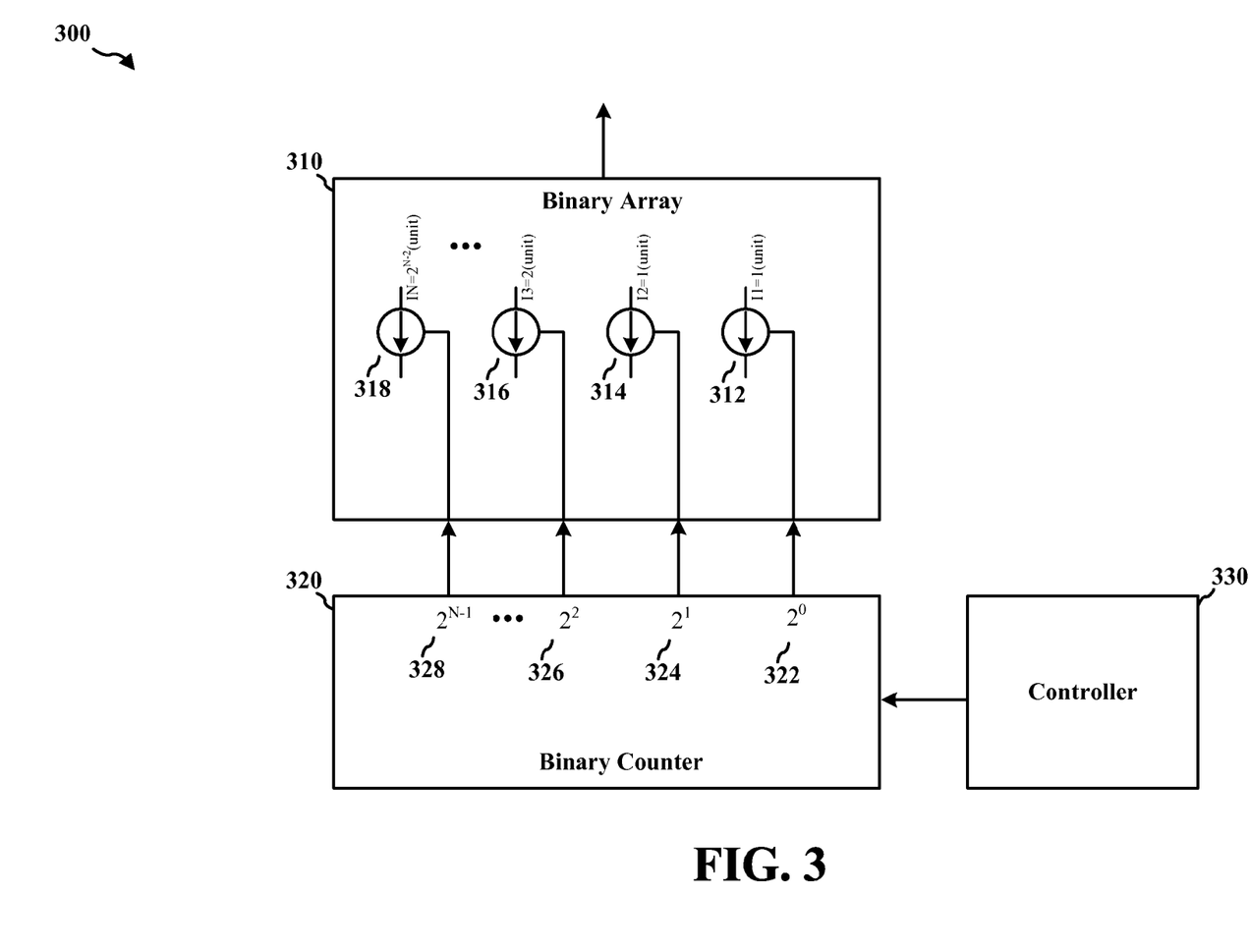
FIG. 3 is a block diagram illustrating a binary array system with a binary array utilizing LSB dithering.

FIG. 3 is a block diagram illustrating a binary array system 300 with a binary array utilizing LSB dithering. Although FIG. 3 provides an example using a binary current source array, other types of binary arrays, such as resistor arrays and capacitors arrays, may be used. As shown in FIG. 3, the binary array 310 may include a number of binary array elements 312, 314, 316, 318. The binary array elements 312, 314, 316, 318 may be current sources, but the binary array elements 312, 314, 316, 318 may also be resistors, capacitors, and other elements.

In one configuration, there may be N binary array elements 312, 314, 316, 318 where N is an integer greater than one. Each of the binary array elements 312, 314, 316, 318 may output a unit value. For example, the first and second binary array elements 312, 314 may have the same unit value (e.g., one). In another example, the third binary array element 316 may have twice the unit value as the first and second binary array elements 312, 314. For example, if N=4, there may be four binary array elements. If the binary array elements 312, 314, 316, 318 are current sources, the first binary array element 312 may be configured to provide a unit value of 1 A, the second binary array element 314 may be configured to provide a unit value of 1 A, the third binary array element 316 may be configured to provide a unit value of 2 A, and the fourth binary array element 318 may be configured to provide a unit value of 4 A. The binary array elements 312, 314, 316, 318 may be coupled to a binary counter 320.

The binary counter 320 is configured to output bit values through each of the bit outputs 322, 324, 326, 328. For example, each of the bit outputs 322, 324, 326, 328 may output a value of 0 or 1. Each of the binary array elements 312, 314, 316, 318 may be coupled to a corresponding one of the bit outputs 322, 324, 326, 328. In one configuration, the first binary array element 312 is coupled to a first bit output 322, the second binary array element 314 is coupled to a second bit output 324, the third binary array element 316 is coupled to a third bit output 326, and the fourth binary array element 318 is coupled to a fourth bit output 328. When a bit output on the binary counter 320 outputs 0 (off state), the corresponding binary array element is turned off. When a bit output on the binary counter 320 outputs 1 (on state), the corresponding binary array element is turned on.

The binary array system 300 includes a controller 330, which may be a processor, microprocessor, DSP, ASIC, programmable logic, or any other suitable electronic circuit. The controller 330 is coupled to the binary counter 320 and configured to set the bit outputs 322, 324, 326, 328 of the binary counter 320 such that only the least significant bit (e.g., output from bit output 322) of the bit values transitions from a first state to a second state in order to effectuate an incremental change in a total unit value provided by the binary array 310. Although illustrated in FIG. 3 as separate components, the binary counter 320 and the controller 330 may be a single component such as a processor.

In one configuration, the incremental change in the total unit value corresponds to a single unit increase in the total unit value provided by the binary array 310, and the first state of the least significant bit is an off state and the second state of the least significant bit is an on state. The single unit increase corresponds to the unit value of the binary array element coupled to the least significant bit of the binary counter 320.

In another configuration, the incremental change in the total unit value corresponds to a single unit decrease in the total unit value provided by the binary array 310, and the first state of the least significant bit is an on state and the second state of the least significant bit is an off state. The single unit decrease corresponds to the unit value of the binary array element coupled to the least significant bit of the binary counter 320.

TABLE 2

| Binary Counter Value | Binary Counter Bit Values | Binary Array Total Unit Value |
|---|---|---|
| 0 | 0000 | 0 A |
| 1 | 0001 | 1 A |
| 2 | 0010 | 1 A |
| 3 | 0011 | 2 A |
| 4 | 0100 | 2 A |
| 5 | 0101 | 3 A |
| 6 | 0110 | 3 A |
| 7 | 0111 | 4 A |
| 8 | 1000 | 4 A |

Table 2 illustrates the total unit value provided by the binary array 310 in response to bit values output by the binary counter 320 in FIG. 3. As shown in Table 2, when the binary counter 320 is at 0, the set of bit outputs 322, 324, 326, 328 is equal to 0000. In this instance, all of the binary array elements 312, 314, 316, 318 are turned off and the total unit value provided by the binary array 310 is 0 A. When the controller 330 causes the binary counter 320 to count to 1, the set of bit outputs 322, 324, 326, 328 is equal to 0001. In this instance, the first binary array element 312 is turned on, but all the other binary array elements 314, 316, 318 are turned off. The total unit value provided by the binary array 310 is 1 A. When the controller 330 causes the binary counter 320 to count to 2, the set of bit outputs 322, 324, 326, 328 is equal to 0010. In this instance, the second binary array element 314 is turned on, but all the other binary array elements 312, 316, 318 are turned off. The total unit value provided by the binary array 310 is 1 A.

When the controller 330 causes the binary counter 320 to count to 3, the set of bit outputs 322, 324, 326, 328 is equal to 0011. In this instance, the first and second binary array elements 312, 314 are turned on, but the remaining third and fourth binary array elements 316, 318 are turned off. The total unit value provided by the binary array 310 is 2 A. When the controller 330 causes the binary counter 320 to count to 4, the set of bit outputs 322, 324, 326, 328 is equal to 0100. In this instance, the third binary array element 316 is turned on, but the remaining binary array elements 312, 314, 318 are turned off. The total unit value provided by the binary array 210 is 2 A.

When the controller 330 causes the binary counter 320 to count to 5, the set of bit outputs 322, 324, 326, 328 is equal to 0101. In this instance, the first and third binary array elements 312, 316 are turned on, but the remaining second and fourth binary array elements 314, 318 are turned off. The total unit value provided by the binary array 210 is 3 A. When the controller 330 causes the binary counter 320 to count to 6, the set of bit outputs 322, 324, 326, 328 is equal to 0110. In this instance, the binary array elements second and third 314, 316 are turned on, but the remaining first and fourth binary array elements 312, 318 are turned off. The total unit value provided by the binary array 310 is 3 A.

When the controller 330 causes the binary counter 320 to count to 7, the set of bit outputs 322, 324, 326, 328 is equal to 0111. In this instance, the first, second, and third binary array elements 312, 314, 316 are turned on, but the fourth binary array element 318 is turned off. The total unit value provided by the binary array 310 is 4 A. When the controller 330 causes the binary counter 320 to count to 8, the set of bit outputs 322, 324, 326, 328 is equal to 1000. In this instance, the fourth binary array element 318 is turned on, but the remaining first, second, and third binary array elements 312, 314, 316 are turned off. The total unit value provided by the binary array 310 is 4 A.

In contrast to the binary array 210 in FIG. 2, the binary array 310 in FIG. 3 avoids the large glitch when the output of the binary counter 320 dithers. Unlike the configuration of FIG. 2, in which multiple bit outputs 222, 224, 226, 228 may need to change in order to increment or decrement the total unit value of the binary array 210, the configuration in FIG. 3 requires only that the LSB bit output 322 change in order to increment or decrement the total unit value of the binary array 310. For example, when a system requires the binary array 310 to output 4 A, the controller 330 causes the binary counter 320 to count up until the output from the binary array 310 has reached 4 A. The binary counter 320 may start at 0000 and count up to 0001.

When the binary counter 320 is at 0001, the total unit value provided by the binary array 310 is 1 A, which is less than the required 4 A. Accordingly, the binary counter 320 counts up to 0010. When the binary counter 320 is at 0010, the total unit value provided by the binary array 310 is still 1 A. The binary counter 320 counts up to 0011. When the binary counter 320 is at 0011, the total unit value provided by the binary array 310 is 2 A, which is less than the required 4 A. The binary counter 320 counts up to 0100.

When the binary counter 320 is at 0100, the total unit value provided by the binary array 310 remains at 2 A. The binary counter 320 counts up to 0101. When the binary counter 320 is at 0101, the total unit value provided by the binary array 310 is 3 A, which is less than 4 A. The binary counter 320 counts up to 0110. When the binary counter 320 output is at 0110, the total unit value provided by the binary array 310 remains at 3 A. The binary counter 320 counts up to 0111. When the binary counter 320 is at 0111, the total unit value provided by the binary array 310 is 4 A. Now that the system receives 4 A from the binary array 310, the controller 330 will not cause the binary counter 320 to count up any further.

TABLE 3

| Binary Array (Binary Counter Dithers Between 3 and 4) | | Binary Array with LSB Dithering (Binary Counter Dithers Between 6 and 7) | |
|---|---|---|---|
| Binary Counter Bit Value | Binary Array Total Unit Value | Binary Counter Bit Value | Binary Array Total Unit Value |
| 0011 | 3A | 0110 | 3A |
| 0000 | 0A | 0111 | 4A |
| 0111 | 7A | | |
| 0100 | 4A | | |

As shown in Table 3, due to signal granularity, the output of the binary counter 320 may dither between 0111 (i.e., 7) and 0110 (i.e., 6) after having counted to 7. When this dithering occurs, only the least significant bit (e.g., the bit output 322) changes from 1 (on state) to 0 (off state). As a result, only the first binary array element 312 turns on and off as a result of the LSB dithering while the remaining second, third, and fourth binary elements 314, 316, 318 stay the same. The result is that the total unit value provided by the binary array 310 may vary between 3 A and 4 A as opposed to 0 A and 7 A. This represents a much smaller potential swing of 1 A compared to the potential swing of 7 A.

Figure 4:
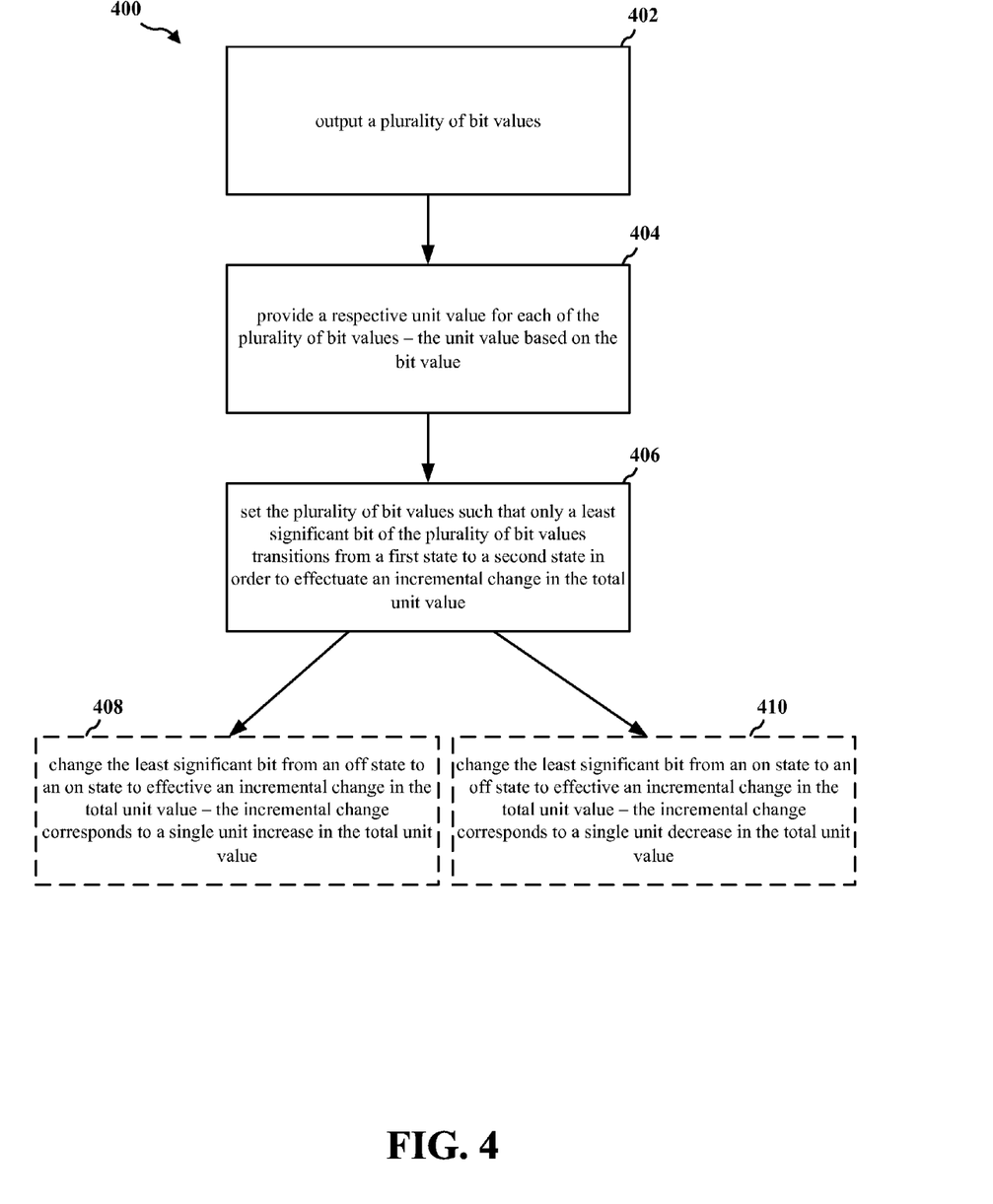
FIG. 4 is a flow chart of a method of controlling a total unit value output by an electrical system.

FIG. 4 is a flow chart 400 of a method of controlling a total unit value output by an electrical system. The method may be performed by a binary array system, such as the one shown in FIG. 3. At step 402, a binary counter of the binary array system outputs a plurality of bit values. For example, the binary counter may output a set of bit values, such as 0110.

At step 404, a binary array of the binary array system provides a corresponding unit value for each of the plurality of bit values. Each of the unit values may be provided by a respective binary array element. For example, if there are four binary current source array elements each having unit values of 1 A, 1 A, 2 A, and 4 A, respectively, then, upon a bit output of 0110 from the binary counter, the binary array provides a unit value based on each of the plurality of bit values for a total unit value of 3 A. At step 406, a controller of the binary array system sets the plurality of bit values output by the binary counter such that only a least significant bit of the plurality of bit values transitions from a first state to a second state in order to effectuate an incremental change in a total unit value.

In one configuration, at step 408, the controller may set the plurality of bit values such that only a least significant bit of the plurality of bit values transitions from an off state to an on state in order to effectuate an incremental change in the total unit value. The incremental change may correspond to a single unit increase in the total unit value, in which the single unit increase corresponds to the unit value output based on the least significant bit of the plurality of bit values. For example, to effectuate an incremental increase in the total unit value from 3 A to 4 A, the controller may change the least significant bit of the binary counter from an off state to an on state. Thus, when the binary counter output transitions from 0110 to 0111, the total unit value experiences a single unit increase from 3 A to 4 A.

In another configuration, at step 410, the controller may set the plurality of bit values such that only a least significant bit of the plurality of bit values transitions from an on state to an off state in order to effectuate an incremental change in the total unit value. The incremental change may correspond to a single unit decrease in the total unit value, in which the single unit increase corresponds to the unit value output based on the least significant bit of the plurality of bit values. For example, to effectuate an incremental decrease in the total unit value from 4 A to 3 A, the controller may set change the least significant bit of the binary counter 320 from an on state to an off state. Thus, when the binary counter output transitions from 0111 to 0110, the total unit value experiences a single unit decrease from 4 A to 3 A.

The unit value output based on the least significant bit and the unit value output based on the next to least significant bit may have the same unit value. For example, as shown in FIG. 3, the unit values output by the first and second binary array elements are 1 A. The unit value output based on the least significant bit and the unit value output based on a next to least significant bit is a first value and the unit value output based on a second next to least significant bit is a second value that may be different from the first value. For example, the second value may be twice the first value. The unit values may correspond to one of resistance, capacitance, or amperage.

Figure 5:
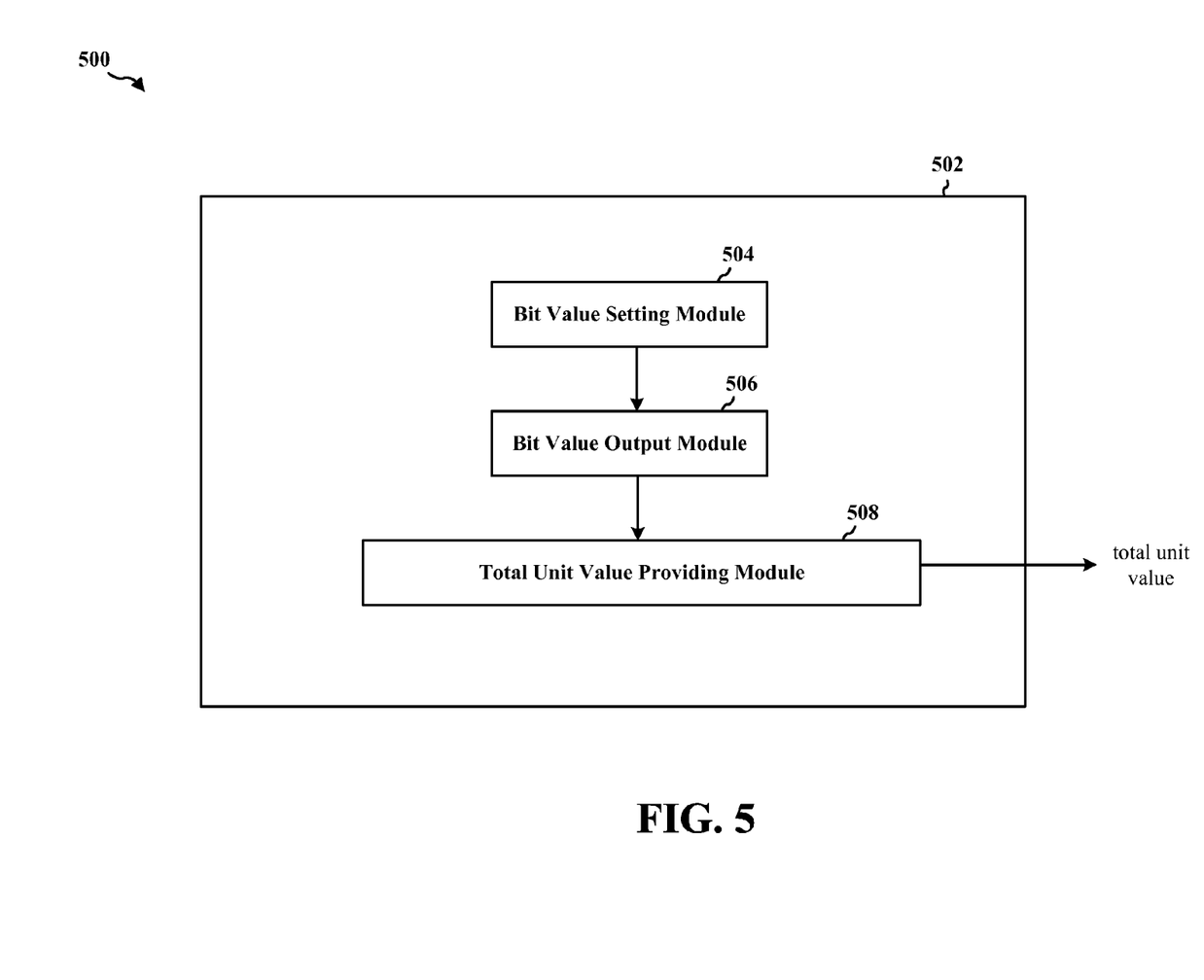
FIG. 5 is a conceptual flow diagram illustrating the data flow between different modules/means/components in an exemplary apparatus.

FIG. 5 is a conceptual data flow diagram 500 illustrating the data flow between different modules/means/components in an exemplary apparatus 502. The apparatus 502 may be a binary array system. The apparatus 502 includes a bit value output module 506 (e.g., the binary counter 320) that may be configured to output a number of bit values. The apparatus 502 also includes a total unit value providing module 508 (e.g., the binary array 310) that may be configured to provide a respective unit value for each of the bit values, the unit value being based on the bit value. The apparatus 502 further includes a bit value setting module 504 that may be configured to set the bit values such that only a least significant bit of the bit values transitions from a first state to a second state in order to effectuate an incremental change in a total unit value.

In one configuration, the incremental change in the total unit value corresponds to a single unit increase in the total unit value. In this configuration, the bit value setting module 504 is configured to change the least significant bit from an off state to an on state. The single unit increase corresponds to the unit value output based on the least significant bit of the plurality of bit values.

In another configuration, the incremental change in the total unit value corresponds to a single unit decrease in the total unit value. In this configuration, the bit value setting module 504 may be configured to change the least significant bit from an on state to an off state. The single unit decrease may correspond to the unit value output based on the least significant bit of the bit values. The unit value output based on the least significant bit and the unit value based on the next to least significant bit may have the same unit value. The unit value output based on the least significant bit and the unit value output based on a next to least significant bit are a first value and the unit value output based on a second next to least significant bit is a second value that may be different from the first value. The second value may be twice the first value. The unit values may correspond to one of resistance, capacitance, or amperage.

The apparatus 502 may include additional modules that perform each of the steps of the algorithm in the aforementioned flow chart of FIG. 4. As such, each step in the aforementioned flow chart of FIG. 4 may be performed by a module and the apparatus 502 may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

Figure 6:
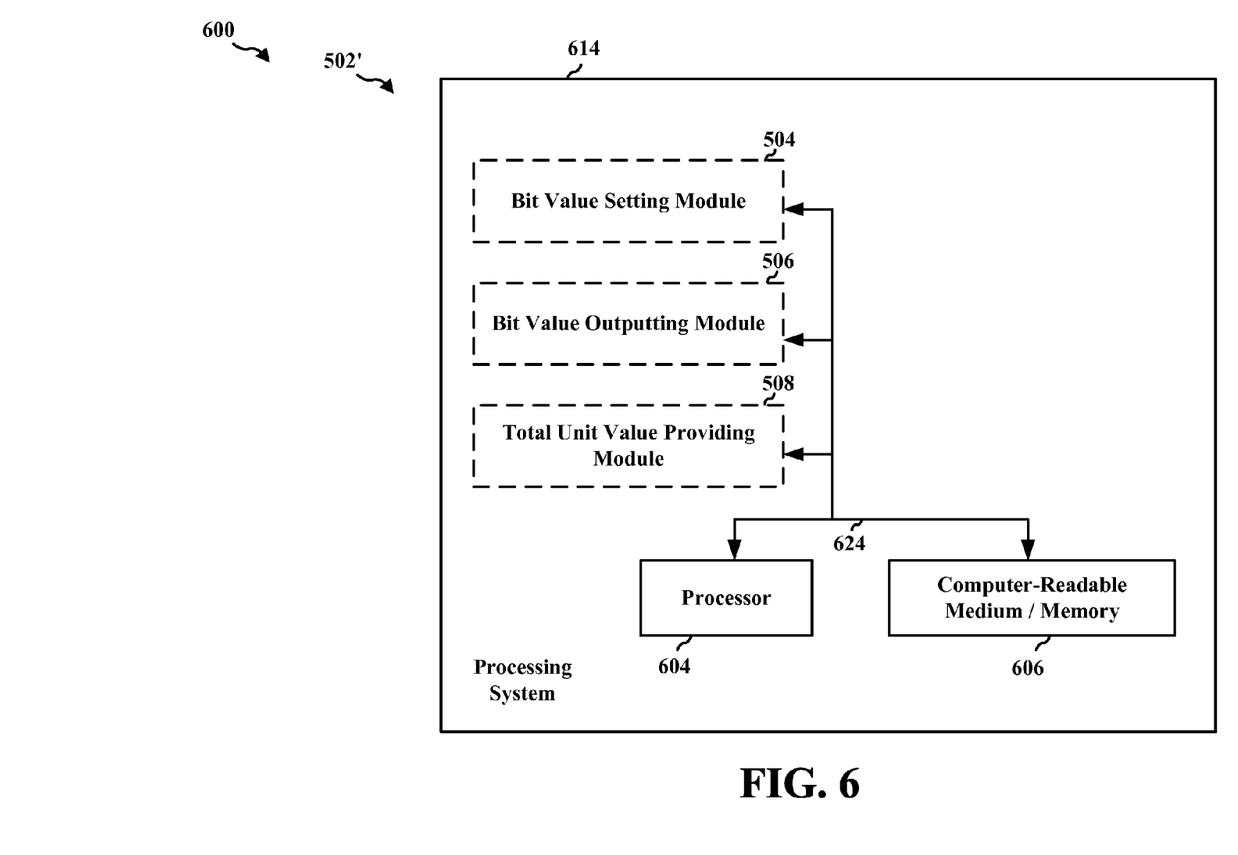
FIG. 6 is a diagram illustrating an example of a hardware implementation for an apparatus employing a processing system.

FIG. 6 is a diagram 600 illustrating an example of a hardware implementation for an apparatus 502' employing a processing system 614. The processing system 614 may be implemented with a bus architecture, represented generally by the bus 624. The bus 624 may include any number of interconnecting buses and bridges depending on the specific application of the processing system 614 and the overall design constraints. The bus 624 links together various circuits including one or more processors and/or hardware modules, represented by the processor 604, the modules 504, 506, 508, and the computer-readable medium/memory 606. The bus 624 may also link various other circuits such as timing sources, peripherals, voltage regulators, and power management circuits, which are well known in the art, and therefore, will not be described any further.

The processing system 614 includes a processor 604 coupled to a computer-readable medium/memory 606. The processor 604 is responsible for general processing, including the execution of software stored on the computer-readable medium/memory 606. The software, when executed by the processor 604, causes the processing system 614 to perform the various functions described supra for any particular apparatus. The computer-readable medium/memory 606 may also be used for storing data that is manipulated by the processor 604 when executing software. The processing system further includes at least one of the modules 504, 506, and 508. The modules may be software modules running in the processor 604, resident/stored in the computer readable medium/memory 606, one or more hardware modules coupled to the processor 604, or some combination thereof.

In one configuration, the apparatus includes means for outputting a plurality of bit values (e.g., the bit value output module 506). The apparatus also includes means for providing a respective unit value for each of the plurality of bit values, the unit value being based on the bit value (e.g., the total unit value providing module 508). The apparatus also includes means for setting the plurality of bit values such that only a least significant bit of the plurality of bit values transitions from a first state to a second state in order to effectuate an incremental change in the total unit value (e.g., the bit value setting module 504).

In one configuration, the incremental change in the total unit value corresponds to a single unit increase in the total unit value, and the means for setting the plurality of bit values is configured to change the least significant bit from an off state to an on state. The single unit increase corresponds to the unit value output based on the least significant bit of the plurality of bit values.

In another configuration, the incremental change in the total unit value corresponds to a single unit decrease in the total unit value, and the means for setting the plurality of bit values is configured to change the least significant bit from an on state to an off state. The single unit decrease corresponds to the unit value output based on the least significant bit of the plurality of bit values.

In another configuration, the unit value output based on the least significant bit and the unit value based on the next to least significant bit have the same unit value. In another configuration, the unit value output based on the least significant bit and the unit value output based on a next to least significant bit are a first value and the unit value output based on a second next to least significant bit is a second value different from the first value. In this configuration, the second value may be twice the first value. In yet another configuration, the unit values may correspond to one of resistance, capacitance, or amperage.

The aforementioned means may be one or more of the aforementioned modules of the apparatus 502 and/or the processing system 614 of the apparatus 502' configured to perform the functions recited by the aforementioned means. The aforementioned means may also be one or more of the components of FIG. 3. For example, the means for outputting a plurality of bit values may be the binary counter 320, the means for providing a respective unit value for each of the plurality of bit values may be the binary array 310, and the means for setting the plurality of bit values such that only a least significant bit of the plurality of bit values transitions from a first state to a second state may be the controller 330.

It is understood that the specific order or hierarchy of steps in the processes/flow charts disclosed is an illustration of exemplary approaches. Based upon design preferences, it is understood that the specific order or hierarchy of steps in the processes/flow charts may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Likewise, the term "embodiment" of an apparatus or method does not require that all embodiments of the invention include the described components, structure, features, functionality, processes, advantages, benefits, or modes of operation. Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A binary array system, comprising:
a binary counter configured to output a plurality of bit values through a plurality of bit outputs, each of the plurality of bit values being output through a corresponding one of the plurality of bit outputs;
a binary array having a plurality of binary array elements, each of the plurality of binary array elements coupled to a corresponding one of the plurality of bit outputs and configured to provide a unit value based on one of the plurality of bit values output through the corresponding one of the plurality of bit outputs; and
a controller coupled to the binary counter and configured to set the plurality of bit values such that a transition of only a least significant bit of the plurality of bit values, of the binary counter, from a first state to a second state effectuates, via the binary array, an incremental change in a total unit value provided by the binary array, wherein a first binary array element coupled to the least significant bit of the binary counter and a second binary array element coupled to the next to least significant bit of the binary counter have the same unit value.

2. The binary array system of claim 1, wherein:
the incremental change in the total unit value corresponds to a single unit increase in the total unit value, and
the first state of the least significant bit is an off state and the second state of the least significant bit is an on state.

3. The binary array system of claim 2, wherein the single unit increase corresponds to the unit value of the binary array element coupled to the least significant bit of the binary counter.

4. The binary array system of claim 1, wherein:
the incremental change in the total unit value corresponds to a single unit decrease in the total unit value, and
the first state of the least significant bit is an on state and the second state of the least significant bit is an off state.

5. The binary array system of claim 4, wherein the single unit decrease corresponds to the unit value of the binary array element coupled to the least significant bit of the binary counter.

6. The binary array system of claim 1, wherein:
the plurality of binary array elements comprise a first binary array element coupled to the least significant bit of the binary counter, a second binary array element coupled to the next to least significant bit of the binary counter, and a third binary array coupled to the second next to least significant bit of the binary counter; and
the unit value of the first binary array element and the unit value of the second binary array element are a first value and the unit value of the third binary array element is a second value different from the first value.

7. The binary array system of claim 6, wherein the second value is twice the first value.

8. The binary array system of claim 1, wherein the binary array is a resistor array, capacitor array, or current source array.

9. A method of controlling a total unit value output by an electrical system, comprising:
outputting a plurality of bit values;
providing a respective unit value for each of the plurality of bit values, the unit value being based on the bit value; and
setting the plurality of bit values, wherein an incremental change in the total unit value is based on a transition of only a least significant bit of the plurality of bit values from a first state to a second state, and wherein the unit value output based on the least significant bit and the unit value based on the next to least significant bit have the same unit value.

10. The method of claim 9, wherein:
the incremental change in the total unit value corresponds to a single unit increase in the total unit value, and
setting the plurality of bit values comprises changing the least significant bit from an off state to an on state.

11. The method of claim 10, wherein the single unit increase corresponds to the unit value output based on the least significant bit of the plurality of bit values.

12. The method of claim 9, wherein:
the incremental change in the total unit value corresponds to a single unit decrease in the total unit value, and
setting the plurality of bit values comprises changing the least significant bit from an on state to an off state.

13. The method of claim 12, wherein the single unit decrease corresponds to the unit value output based on the least significant bit of the plurality of bit values.

14. The method of claim 9, wherein the unit value output based on the least significant bit and the unit value output based on a next to least significant bit are a first value and the unit value output based on a second next to least significant bit is a second value different from the first value.

15. The method of claim 14, wherein the second value is twice the first value.

16. The method of claim 9, wherein unit values correspond to one of resistance, capacitance, or amperage.

17. An electrical system for controlling a total unit value being outputted, comprising:
- means for outputting a plurality of bit values;
- means for providing a respective unit value for each of the plurality of bit values, the unit value being based on the bit value; and
- means for setting the plurality of bit values such that a transition of only a least significant bit of the plurality of bit values from a first state to a second state effectuates, via the means for providing the respective unit value, an incremental change in the total unit value, wherein the unit value output based on the least significant bit and the unit value based on the next to least significant bit have the same unit value.

18. The electrical system of claim 17, wherein:
- the incremental change in the total unit value corresponds to a single unit increase in the total unit value, and
- the means for setting the plurality of bit values is configured to change the least significant bit from an off state to an on state.

19. The electrical system of claim 18, wherein the single unit increase corresponds to the unit value output based on the least significant bit of the plurality of bit values.

20. The electrical system of claim 17, wherein:
- the incremental change in the total unit value corresponds to a single unit decrease in the total unit value, and
- the means for setting the plurality of bit values is configured to change the least significant bit from an on state to an off state.

21. The electrical system of claim 20, wherein the single unit decrease corresponds to the unit value output based on the least significant bit of the plurality of bit values.

22. The electrical system of claim 17, wherein the unit value output based on the least significant bit and the unit value output based on a next to least significant bit are a first value and the unit value output based on a second next to least significant bit is a second value different from the first value.

23. The electrical system of claim 22, wherein the second value is twice the first value.

24. The electrical system of claim 17, wherein unit values correspond to one of resistance, capacitance, or amperage.

25. A non-transitory computer-readable medium storing computer executable code for controlling a total unit value being outputted, comprising code to:
- output a plurality of bit values;
- provide a respective unit value for each of the plurality of bit values, the unit value being based on the bit value; and
- set the plurality of bit values, wherein an incremental change in the total unit value is based on a transition of only a least significant bit of the plurality of bit values from a first state to a second state, and wherein the unit value output based on the least significant bit and the unit value based on the next to least significant bit have the same unit value.

26. The non-transitory computer-readable medium of claim 25, wherein:
- the incremental change in the total unit value corresponds to a single unit increase in the total unit value, and
- setting the plurality of bit values comprises changing the least significant bit from an off state to an on state.

27. The non-transitory computer-readable medium of claim 25, wherein:
- the incremental change in the total unit value corresponds to a single unit decrease in the total unit value, and
- setting the plurality of bit values comprises changing the least significant bit from an on state to an off state.

* * * * *